(12) United States Patent
Abou-Khalil et al.

(10) Patent No.: US 8,217,455 B2
(45) Date of Patent: Jul. 10, 2012

(54) SEMICONDUCTOR-ON-INSULATOR DEVICE STRUCTURES WITH A BODY-TO-SUBSTRATE CONNECTION FOR ENHANCED ELECTROSTATIC DISCHARGE PROTECTION, AND DESIGN STRUCTURES FOR SUCH SEMICONDUCTOR-ON-INSULATOR DEVICE STRUCTURES

(75) Inventors: Michel J. Abou-Khalil, Essex Junction, VT (US); Robert J. Gauthier, Jr., Hinesburg, VT (US); Tom C. Lee, Essex Junction, VT (US); Junjun Li, Williston, VT (US); Christopher S. Putnam, Hinesburg, VT (US); Souvick Mitra, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 879 days.

(21) Appl. No.: 12/102,032

(22) Filed: Apr. 14, 2008

(65) Prior Publication Data
US 2009/0256202 A1 Oct. 15, 2009

(51) Int. Cl.
*H01L 27/12* (2006.01)
(52) U.S. Cl. .................. 257/347; 257/93; 257/374
(58) Field of Classification Search ............. 257/347, 257/313, 93, 374, 354, E29.001, E29.007; 438/221
See application file for complete search history.

(56) References Cited

U.S. PATENT DOCUMENTS

| | | | |
|---|---|---|---|
| 5,587,604 A | 12/1996 | Machesney et al. | |
| 5,798,534 A * | 8/1998 | Young | 257/409 |
| 5,894,152 A * | 4/1999 | Jaso et al. | 257/347 |
| 6,281,593 B1 | 8/2001 | Brown et al. | |
| 6,410,962 B2 * | 6/2002 | Geissler et al. | 257/355 |
| 6,436,744 B1 | 8/2002 | Bryant et al. | |
| 6,514,809 B1 | 2/2003 | Xiang | |
| 6,621,133 B1 * | 9/2003 | Chen et al. | 257/409 |
| 6,649,964 B2 | 11/2003 | Kim | |
| 6,667,518 B2 * | 12/2003 | Christensen et al. | 257/350 |
| 6,670,675 B2 | 12/2003 | Ho et al. | |
| 8,097,522 B2 * | 1/2012 | Williams et al. | 438/424 |
| 2002/0197820 A1 | 12/2002 | Watt | 438/420 |
| 2007/0001226 A1 * | 1/2007 | Takahashi | 257/347 |
| 2008/0036029 A1 * | 2/2008 | Liu et al. | 257/510 |
| 2008/0224219 A1 * | 9/2008 | Saiki et al. | 257/355 |

* cited by examiner

*Primary Examiner* — Kevin M Picardat
*Assistant Examiner* — Neil Prasad
(74) *Attorney, Agent, or Firm* — Wood, Herron & Evans, LLP; Anthony J. Canale

(57) ABSTRACT

Semiconductor-on-insulator device structures with enhanced electrostatic discharge protection, and design structures for an integrated circuit with device structures exhibiting enhanced electrostatic discharge protection. A device is formed in a body region of a device layer of a semiconductor-on-insulator substrate, which is bounded by an inner peripheral sidewall of an annular dielectric-filled isolation structure that extends from a top surface of the device layer to the insulating layer of the semiconductor-on-insulator substrate. An annular conductive interconnect extends through the body region and the insulating layer to connect the body region with the bulk wafer of the semiconductor-on-insulator substrate. The annular conductive interconnect is disposed inside the inner peripheral sidewall of the isolation structure, which annularly encircles the body region.

14 Claims, 4 Drawing Sheets

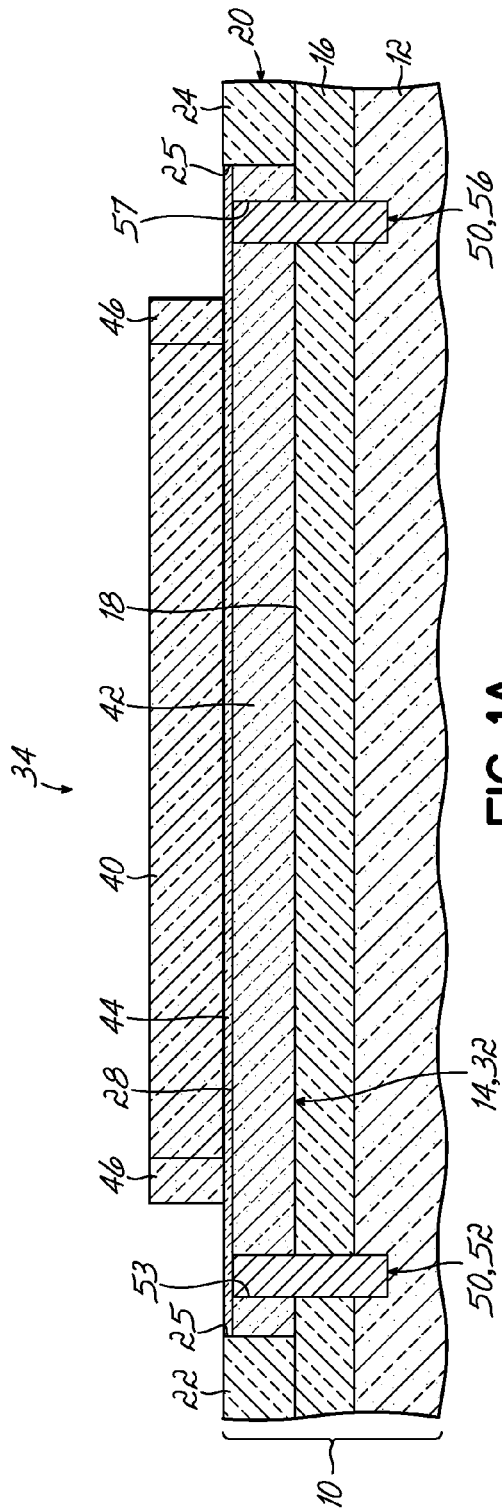
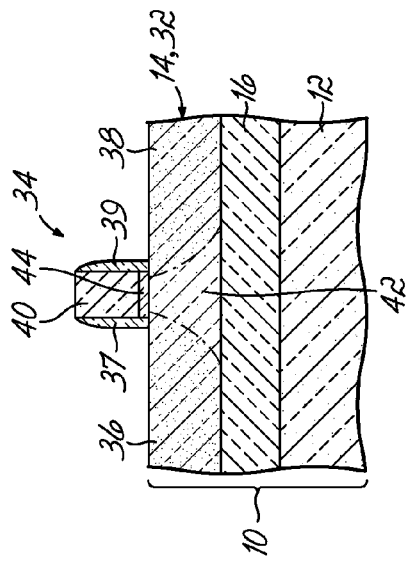
FIG. 1A
FIG. 1B

SEMICONDUCTOR-ON-INSULATOR DEVICE STRUCTURES WITH A BODY-TO-SUBSTRATE CONNECTION FOR ENHANCED ELECTROSTATIC DISCHARGE PROTECTION, AND DESIGN STRUCTURES FOR SUCH SEMICONDUCTOR-ON-INSULATOR DEVICE STRUCTURES

FIELD OF THE INVENTION

The invention relates generally to semiconductor device fabrication and, in particular, to semiconductor-on-insulator device structures with enhanced electrostatic discharge protection, and design structures for an integrated circuit with device structures exhibiting enhanced electrostatic discharge protection.

BACKGROUND OF THE INVENTION

Devices fabricated using silicon-on-insulator (SOI) technologies provide certain performance improvements, such as lower parasitic junction capacitance, increased latchup resistance, and reduced power consumption at equivalent performance, in comparison with comparable devices built directly in a bulk silicon substrate. Generally, an SOI substrate includes a thin SOI or device layer of semiconductor material (e.g., single crystal silicon) partitioned by isolation regions to define discrete electrically-isolated regions for building device structures and a thin buried layer of an insulator, such as a buried oxide ($SiO_2$) layer, physically separating and electrically isolating the SOI layer from a bulk wafer.

Chips are often exposed to electrostatic discharge (ESD) events leading to potentially large and damaging currents within the integrated circuit. Contingent upon the circumstances, electrostatic discharge events may be classified using a human body model, a machine model, or a charged device model. The human body model applies when a human carrying an electrostatic charge inadvertently touches exposed pins of a module and transfers the electrostatic charge in an ESD event to the integrated circuit inside the package. The machine model applies for an ESD event initiated by contact with an electrostatically charged conductive object, such as a metallic tool or fixture. The charged device model applies when the integrated circuit or module itself electrostatically charges from, for example, sliding down a feeder in an automated assembler or jostling inside a tray during handling. Contact with an insertion head or another conductive surface prompts an ESD event may occur from the integrated circuit or module to the metal object. Under any of these models, a large current develops in the integrated circuit during the ESD event. Unless protected, the devices of the integrated circuit can be irreversibly damaged.

In one conventional approach, non-self protecting diodes supply ESD protection for integrated circuits formed using the device layer of an SOI substrate. One problem with this solution is that the diode area is relatively large in comparison with the overall chip area and, in some chip designs, may occupy in the range of three percent to five percent of the overall chip area. Another problem with the use of diodes is that, because of time delays in sensing the ESD event, the integrated circuit that the diode is protecting may fail before the diode fully turns on.

What is needed, therefore, are device structures for protecting SOI devices from ESD events, as well as fabrication methods for these device structures and design structures for integrated circuits including these protected device structures.

SUMMARY OF THE INVENTION

In accordance with an embodiment of the invention, a device structure is provided that is formed using an SOI substrate with a device layer, a bulk wafer, and an insulating layer separating the device layer from the bulk wafer. The device structure includes an annular dielectric-filled isolation structure having an inner sidewall extending from a top surface of the device layer to the insulating layer, a device structure in the body region, and an annular conductive interconnect extending through the body region and the insulating layer to physically connect the body region with the bulk wafer. The inner sidewall of the isolation structure encircles the body region of the device layer. The annular conductive interconnect is disposed peripherally inside the inner peripheral sidewall of the isolation structure.

In another embodiment, the device structure may be included in a design structure embodied in a machine readable medium for designing, manufacturing, or testing an integrated circuit. The design structure may comprise a netlist. The design structure may also reside on storage medium as a data format used for the exchange of layout data of integrated circuits. The design structure may also reside in a programmable gate array.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

FIG. 1A is a diagrammatic cross-sectional view taken generally along line 1A-1A in FIG. 1.

FIG. 1B is a diagrammatic cross-sectional view taken generally along line 1B-1B in FIG. 1.

DETAILED DESCRIPTION

Embodiments of the invention relate generally to a device structure formed upon using a device layer of an SOI substrate. The device structure includes a device, which may representatively be a field effect transistor, formed in a body region defined from the device layer by surrounding shallow trench isolation. A conductive contact or interconnect is coupled to the body region and extends through a dielectric layer (e.g., a BOX layer) of the SOI substrate to the bulk substrate. The interconnect may be defined as a series of elongated bars, studs, or pillars located near the periphery of the device region and physically spaced away from a channel of the device region. The interconnect, which is annular, is located peripherally inside the inner perimeter of the shallow trench isolation.

The interconnect improves heat dissipation from the body region and the operating device in the body region by providing a direct heat dissipation path filled by a high thermal conductivity material from the body region to the bulk wafer, which operates as a heat sink. The interconnect also effectively increases the electrical resistance of the body region because of the high sheet resistance of the bulk wafer.

Figure 1:
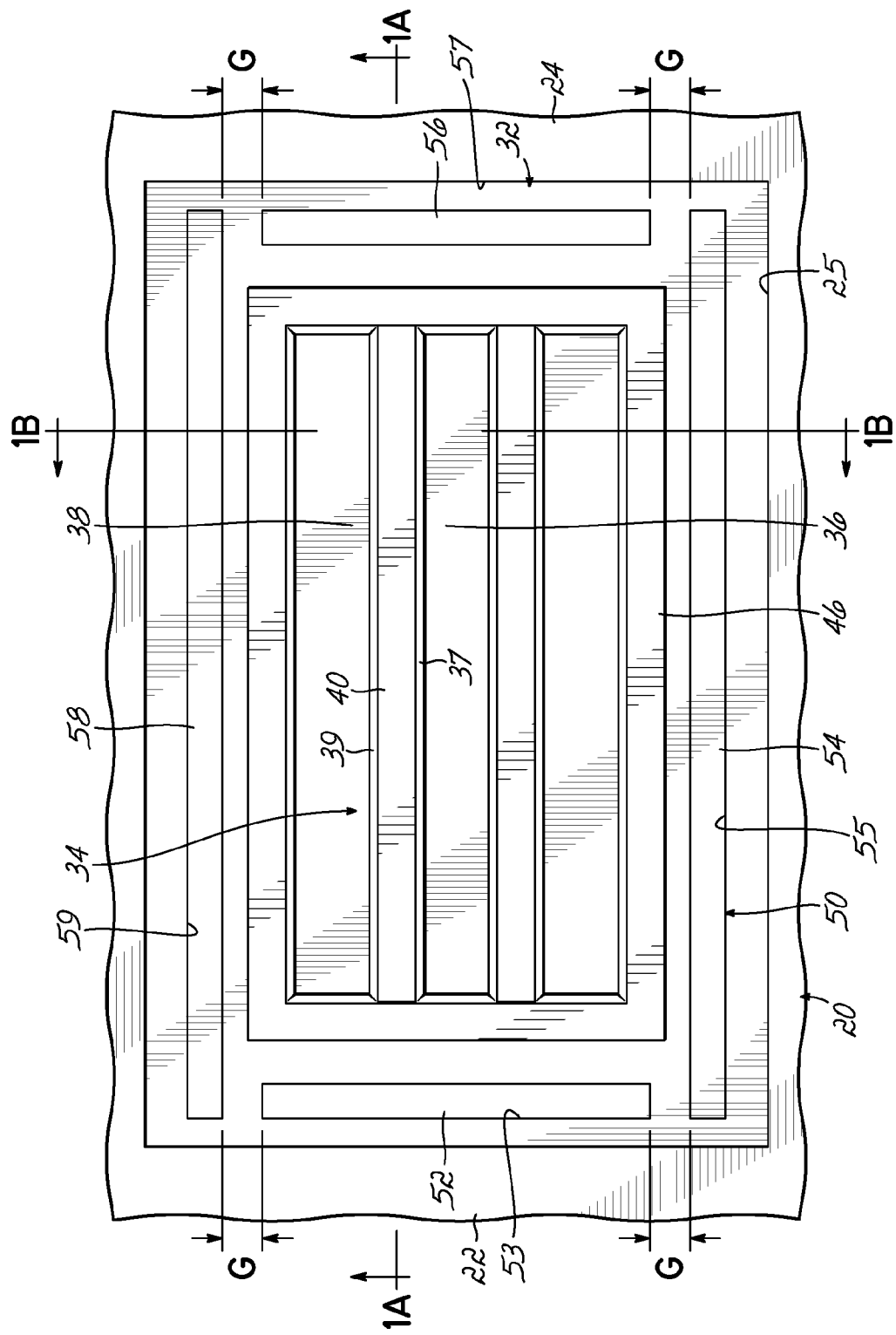
FIG. 1 is a diagrammatic top view of a portion of a substrate in accordance with an embodiment of the invention.

With reference to FIGS. 1, 1A, and 1B and in accordance with an embodiment of the invention, a semiconductor-on-insulator (SOI) substrate 10 includes a bulk wafer 12, a device or SOI layer 14, and a buried insulating layer 16 formed of an insulating material. The buried insulating layer 16 may be a buried oxide layer containing silicon dioxide (e.g., $SiO_2$). The SOI layer 14 is separated from the bulk wafer 12 by the intervening buried insulating layer 16. The SOI layer 14 is composed of monocrystalline semiconductor material, such as single crystal silicon or another material that contains primarily silicon. The bulk wafer 12 may also be constituted by a single crystal or monocrystalline semiconductor material, such as silicon, or another type of material. The buried insulating layer 16 electrically isolates the bulk wafer 12 from the SOI layer 14, which is considerably thinner than the bulk wafer 12 and is in direct contact along a planar interface with a top surface 18 of the buried insulating layer 16.

An annular isolation structure 20, which includes a series of continuous isolation regions of which isolation regions 22, 24 are representative, is defined using a conventional process in the SOI layer 14. In one embodiment, the isolation structure 20 is formed by a shallow trench isolation (STI) technique that relies on a conventional lithography and dry etching process to define trenches extending to the buried insulating layer 16, fills the trenches with portions of a dielectric material, and planarizes the layer to a top surface 28 of SOI layer 14 using a chemical mechanical polishing (CMP) process. After the planarization, the residual dielectric material disposed inside the trenches, which have a closed annular arrangement, defines the isolation structure 20 that is embedded in the SOI layer 14. The dielectric material composing the isolation structure 20 may be an oxide, such as densified tetraethylorthosilicate (TEOS) deposited by thermal chemical vapor deposition (CVD) or a high-density plasma (HDP) oxide deposited with plasma assistance.

The isolation structure 20, including isolation regions 22, 24, has an inner sidewall 25 that extends from the top surface 28 of SOI layer 14 to the top surface 18 of the buried insulating layer 16. The isolation structure 20 delineates and encircles a body region 32 of the SOI layer 14, which is electrically isolated from adjacent device regions (not shown) defined in the SOI layer 14. The body region 32 is peripherally inside the inner sidewall 25 of the isolation structure 20.

A device, generally indicated by reference number 34, is formed using the semiconductor material of the body region 32. The device 34 may consist of one or more metal-oxide-semiconductor field effect transistors (MOSFET) each having a source 36, a drain 38, and a gate electrode 40 located above a channel 42, which is generally defined in the SOI layer 14 laterally between the source 36 and drain 38. A thin gate dielectric layer 44 electrically insulates the gate electrode 40 from the channel 42. Candidate dielectric materials for the gate dielectric layer 44 include, but are not limited to, silicon oxynitride ($SiO_xN_y$), silicon nitride ($Si_3N_4$), silicon dioxide ($SiO_2$), a hafnium-based dielectric material like hafnium oxide ($HfO_2$) or hafnium oxynitride (HfSiON), and layered stacks of these and other dielectric materials. The material used to form the gate electrode 40 may be, for example, polysilicon, a metal like tungsten or a tungsten alloy, or any other suitable conductor. The source 36, drain 38, and their extensions and halos may be supplied by diffusion and/or ion implantation of suitable dopant species. The source 36, drain 38, and their extensions and halos may be doped to form either an n-channel MOSFET or a p-channel MOSFET. Sidewall spacers 37, 39 of a material such as silicon nitride are applied to the vertical sidewalls of the gate electrode 40 by a spacer formation technique familiar to a person having ordinary skill in the art. The elements of the device 34 are fabricated by conventional processes familiar to a person having ordinary skill in the art of device manufacturing.

Extending peripherally about the body region 32 of the SOI layer 14 is a closed annular ring of separation polysilicon 46 (polycrystalline silicon). The separation polysilicon 46 may be deposited using a known deposition process, such as physical vapor deposition (PVD) or CVD, and patterned to define the closed annular ring. The separation polysilicon 46 functions to prevent the source 36 and/or drain 38 from being electrically shorted to the bulk wafer 12.

With continued reference to FIGS. 1 and 1A, a contact in the form of an annular interconnect 50, which is used to provide ESD protection to the device 34 built using the body region 32, is defined in the body region 32. The interconnect 50 includes a plurality of individual segments 52, 54, 56, 58 that have an annular arrangement about the periphery of the body region 32, but are disposed peripherally inside the isolation structure 20. Generally, the interconnect 50 is disposed peripherally between the inner sidewall 25 of the isolation structure 20 and the source 36, drain 38, and channel 42 of the device 34. Although the interconnect 50 and the isolation structure 20, as well as the sidewall 25, are depicted as having a generally rectangular geometrical shape, a person having ordinary skill in the art understands that their respective geometric shapes viewed from a perspective normal to the top surface 28 are not so limited to and may be polygonal with an arbitrary number of sides, square, or even round or circular.

The segments 52, 54, 56, 58 of the interconnect 50 are formed in respective trenches 53, 55, 57, 59 that extend through the semiconductor material of the SOI layer 14 and the dielectric material of the buried insulating layer 16, and project a shallow depth into the bulk wafer 12. The interconnect 50 bridges the buried insulating layer 16 to physically and electrically connect the SOI layer 14 with the bulk wafer 12 and, more specifically, to physically and electrically connect the body region 32 with the bulk wafer 12. The segments 52, 54, 56, 58 have a spatial arrangement so that the interconnect 50 has the annular shape that encircles or surrounds the body region 32. Adjacent pairs of segments 52, 54, 56, 58 are separated by respective gaps, G, extending from the top surface 28 of the SOI layer 14 to the buried insulating layer 16, which means that the interconnect 50 is discontinuous and includes breaks or discontinuities between adjacent pairs of segments 52, 54, 56, 58. The width of the gaps, G, may be defined as the minimum spacing between adjacent segments 52, 54, 56, 58 required to satisfy design ground rules. In various embodiments, the segments 52, 54, 56, 58 may be characterized as pillars, studs or bars. Each of the gaps, G, is filled by a portion of the semiconductor material of the body region 32.

The interconnect 50 is composed of a material having a relatively high electrical conductivity and a relatively high thermal conductivity in comparison to the semiconductor material constituting the SOI layer 14 and the dielectric material in the buried insulating layer 16. In various embodiments, the interconnect 50 may be composed of various different metals or metal alloys including, but not limited to, tungsten or a tungsten alloy.

The interconnect 50 may be formed by patterning the body region 32 using a conventional lithography and etching process to define individual trenches 53, 55, 57, 59 arranged with the annular pattern and filling the resulting trenches 53, 55, 57, 59 with a conductor. The lithography process entails applying a resist (not shown) and a hard mask (not shown) on the body region 32, exposing the resist to a pattern of radiation to create a latent pattern of the trenches in the resist for the interconnect 50, developing the latent pattern in the exposed resist, transferring the developed pattern to the hard mask with a dielectric etching process, and stripping the residual resist with plasma ashing or a chemical stripper. The trench pattern is transferred from the hard mask to the body region 32, buried insulating layer 16, and bulk wafer 12 by an anisotropic etching process, such as reactive-ion etching (RIE), that may be conducted in a single etching step or in multiple etching steps with different etch chemistries. After etching is concluded, the hard mask is removed. The resulting trenches 53, 55, 57, 59 extend in a vertical direction substantially transverse to a plane containing the top surface 28 of the SOI layer 14. The trenches 53, 55, 57, 59 are filled with a conductor by depositing a blanket layer of a metal and planarizing to the top surface 28 of the SOI layer 14 using, for example, a CMP process.

The physical connection provided by the interconnect 50 establishes thermal contact between the body region 32 and bulk wafer 12 and provide a heat transfer path from the body region 32 to the bulk wafer 12. As a result, heat generated during operation of the device 34 is efficiently dissipated from the body region 32 to the bulk wafer 12, which operates as a thermal sink. The interconnect 50 also electrically interconnects the SOI layer 14 with the bulk wafer 12 to provide an efficient current path in the event of an ESD event. In comparison with the ESD protection afforded by conventional diodes, the interconnect 50 may increase the protective current handling capability during an ESD event by a factor of three or so.

The interconnect 50 provides an ESD self-protection capability that is applicable for SOI technologies. When an ESD event occurs, the parasitic n-p-n associated with the device 34 turns fully on. The interconnect 50 may be formed using recognized process procedures and without the need for additional masks or ion implantations. The interconnect 50 permits a significant reduction in the overall chip area for implementing ESD protection in comparison with the conventional protection diode approach.

During the fabrication process for the integrated circuit, the device 34 and interconnect 50 are replicated across at least a portion of the surface area of the SOI layer 14 in other body regions similar to body region 32. Standard processing follows, which includes silicide formation, formation of metallic contacts, and metallization for the M1 level interconnect wiring, as well as interlayer dielectric layers, conductive vias, and metallization for upper level (M2-level, M3-level, etc.) interconnect wiring. Metallization in the contact level of the interconnect wiring establishes electrical connections with the gate electrode 40 and independent electrical connections with the source 36 and drain regions 38.

In accordance with an alternative embodiment of the invention, a liner (not shown) may be disposed on the sidewalls of the trenches 53, 55, 57, 59 bearing the interconnect 50. The liner is composed of a dielectric material that electrically isolates the interconnect 50 from the body region 32 but has a thermal conductivity such that heat dissipation from the body region 32 to the bulk wafer 12 via the interconnect 50 is retained. In one embodiment, the liner may only be disposed between the interconnect 50 and the body region 32. Candidate dielectric materials for the liner include, but are not limited to, $SiO_xN_y$, $Si_3N_4$, $SiO_2$, a hafnium-based dielectric material like $HfO_2$ or hafnium oxynitride HfSiON, and layered stacks of these and other dielectric materials.

Figure 2:
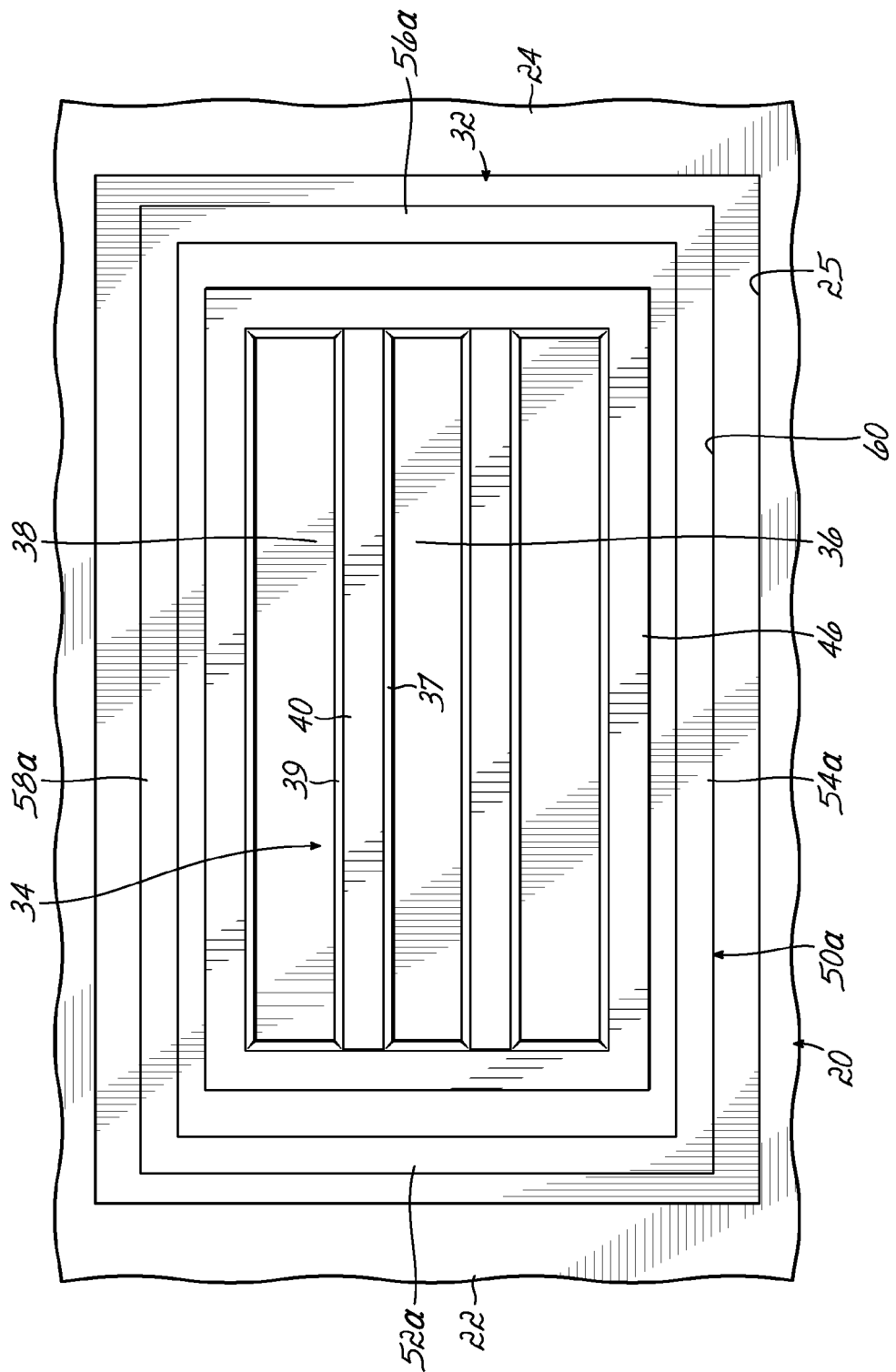
FIG. 2 is a diagrammatic top view similar to FIG. 1 in accordance with an alternative embodiment of the invention.

With reference to FIG. 2 in which like reference numerals refer to like features in FIGS. 1, 1A, 1B and in accordance with an alternative embodiment of the invention, the design ground rules may be violated to close or eliminate the gaps, G, and form an interconnect 50a includes segments 52a, 54a, 56a, 58a that are continuous and intersect orthogonally at the junction of each adjacent pair. Otherwise, the interconnect 50a is identical in construction and function to interconnect 50 (FIGS. 1, 1A) and has an appearance in cross-section identical to that shown in FIG. 1A for interconnect 50. The interconnect 50a, which is formed in a continuous annular trench 60, physically connects the body region 32 with the bulk wafer 12 to provide an electrical connection effective for ESD protection and a heat dissipation path. Similar to the formation of interconnect 50, interconnect 50a may be formed by patterning the body region 32 using a conventional lithography and etching process to define the closed annular trench 60 extending through the body region 32 and buried insulating layer 16, as well as into the bulk wafer 12, and then filling the closed annular trench 60 with a conductor. A liner may be optionally added as an intervening structural element between the sidewalls of the trench 60 and the interconnect 50.

Figure 3:
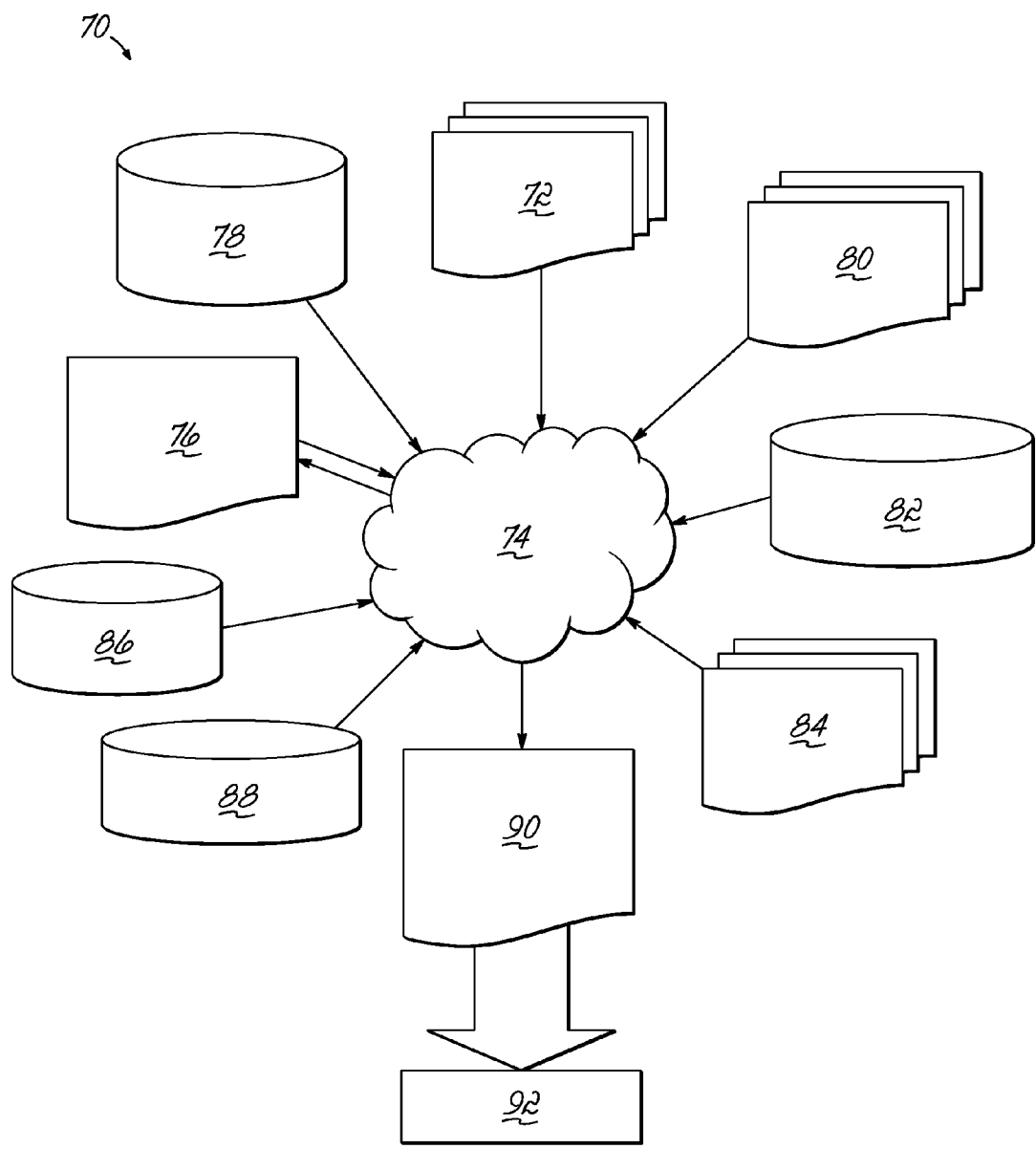
FIG. 3 is a flow diagram of a design process used in semiconductor design, manufacture, and/or test.

FIG. 3 shows a block diagram of an exemplary design flow 70 used for example, in semiconductor design, manufacturing, and/or test. Design flow 70 may vary depending on the type of IC being designed. For example, a design flow 70 for building an application specific IC (ASIC) may differ from a design flow 70 for designing a standard component or from a design flow 70 for instantiating the design into a programmable array, for example a programmable gate array (PGA) or a field programmable gate array (FPGA) offered by Altera® Inc. or Xilinx® Inc. Design structure 72 is preferably an input to a design process 74 and may come from an IP provider, a core developer, or other design company or may be generated by the operator of the design flow, or from other sources. Design structure 72 comprises an embodiment of the invention as shown in FIGS. 1, 1A or FIG. 2 in the form of schematics or HDL, a hardware-description language (e.g., Verilog, VHDL, C, etc.). Design structure 72 may be contained on one or more machine readable medium. For example, design structure 72 may be a text file or a graphical representation of an embodiment of the invention as shown in FIGS. 1, 1A or FIG. 2. Design process 74 preferably synthesizes (or translates) an embodiment of the invention as shown in FIGS. 1, 1A or FIG. 2 into a netlist 76, where netlist 76 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 76 is resynthesized one or more times depending on design specifications and parameters for the circuit.

Design process 74 may include using a variety of inputs; for example, inputs from library elements 78 which may house a set of commonly used elements, circuits, and devices, including models, layouts, and symbolic representations, for a given manufacturing technology (e.g., different technology nodes, 32 nm, 45 nm, 90 nm, etc.), design specifications 80, characterization data 82, verification data 84, design rules 86, and test data files 88 (which may include test patterns and other testing information). Design process 74 may further include, for example, standard circuit design processes such as timing analysis, verification, design rule checking, place and route operations, etc. One of ordinary skill in the art of integrated circuit design can appreciate the extent of possible electronic design automation tools and applications used in design process 74 without deviating from the scope and spirit of the invention. The design structure of the invention is not limited to any specific design flow.

Design process 74 preferably translates an embodiment of the invention as shown in FIGS. 1, 1A or FIG. 2, along with any additional integrated circuit design or data (if applicable), into a second design structure 90. Design structure 90 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 90 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 1A or FIG. 2. Design structure 90 may then proceed to a stage 92 where, for example, design structure 90: proceeds to tape-out, is released to manufacturing, is released to a mask house, is sent to another design house, is sent back to the customer, etc.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

It will be understood that when an element as a layer, region or substrate is described as being "on" or "over" another element, it can be directly on or over the other element or intervening elements may also be present. In contrast, when an element is described as being "directly on" or "directly over" another element, there are no intervening elements present. It will also be understood that when an element is described as being "connected" or "coupled" to another element, it can be directly connected or coupled to the other element or intervening elements may be present. In contrast, when an element is described as being "directly connected" or "directly coupled" to another element, there are no intervening elements present.

The fabrication of the semiconductor structure herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A device structure formed using an SOI substrate with a device layer, a bulk wafer, and an insulating layer separating the device layer from the bulk wafer, the device structure comprising:
    an annular isolation structure filled with a dielectric material, the annular isolation structure having an inner peripheral sidewall extending from a top surface of the device layer to the insulating layer;
    a body region of the device layer, the body region disposed inside the inner peripheral sidewall of the annular isolation structure;
    a device in the body region; and
    an annular conductive interconnect extending through the body region and the insulating layer to physically connect the body region with the bulk wafer, the annular conductive interconnect disposed peripherally inside the inner peripheral sidewall of the isolation structure so that a portion of the body region is disposed laterally between the conductive interconnect and the inner peripheral sidewall of the annular isolation structure.

2. The device structure of claim 1 wherein the device structure includes a first portion of the body region doped to define a drain, a second portion of the body region doped to define a source, a gate electrode, an gate dielectric layer between the gate electrode and the top surface of the device layer, and a channel in the body region between the source and the drain and beneath the gate electrode, and the annular conductive interconnect is disposed within the body region with a first physical spacing from the channel and a second physical spacing from the inner peripheral sidewall of the isolation structure.

3. The device structure of claim 1 wherein the body region is composed of a semiconductor material, the annular conductive interconnect includes a plurality of segments having an annular arrangement about the body region and with a gap between each pair of adjacent segments that is filled by a portion of the semiconductor material.

4. The device structure of claim 1 wherein the annular conductive interconnect is a continuous structure.

5. The device structure of claim 1 wherein the annular conductive interconnect is composed of tungsten or a tungsten alloy.

6. The device structure of claim 1 wherein the annular interconnect is formed in at least one trench extending through the body region and the insulating layer and into the bulk wafer, and further comprising:
    a liner of a dielectric material disposed between the annular interconnect and at least the body region.

7. A design structure embodied in a machine readable medium for designing, manufacturing, or testing an integrated circuit, the design structure comprising:
- an annular isolation structure filled with a dielectric material, the annular isolation structure having an inner peripheral sidewall extending from a top surface of a device layer of an SOI substrate to an insulating layer of the SOI substrate;
- a body region of the device layer, the body region disposed inside the inner peripheral sidewall of the annular isolation structure;
- a device in the body region; and
- an annular conductive interconnect extending through the body region and the insulating layer to physically connect the body region with a bulk wafer of the SOI substrate, the annular conductive interconnect disposed peripherally inside the inner peripheral sidewall of the isolation structure so that a portion of the body region is disposed laterally between the conductive interconnect and the inner peripheral sidewall of the annular isolation structure.

8. The design structure of claim 7 wherein the design structure comprises a netlist.

9. The design structure of claim 7 wherein the design structure resides on storage medium as a data format used for the exchange of layout data of integrated circuits.

10. The design structure of claim 7 wherein the design structure resides in a programmable gate array.

11. A device structure formed using an SOI substrate with a device layer, a bulk wafer, and an insulating layer separating the device layer from the bulk wafer, the device structure comprising:
- an annular isolation structure filled with a dielectric material and having an inner peripheral sidewall extending from a top surface of the device layer to the insulating layer;
- a body region of the device layer, the body region composed of semiconductor material and disposed inside the inner peripheral sidewall of the annular isolation structure;
- a device in the body region; and
- an annular conductive interconnect composed of tungsten or a tungsten alloy and extending through the body region and the insulating layer to physically connect the body region with the bulk wafer, the annular conductive interconnect disposed peripherally inside the inner peripheral sidewall of the isolation structure so that a portion of the body region is disposed laterally between the conductive interconnect and the inner peripheral sidewall of the annular isolation structure and including a plurality of segments having an annular arrangement about the body region and with a gap between each pair of adjacent segments that is filled by a portion of the semiconductor material.

12. The device structure of claim 1 wherein the annular conductive interconnect is disposed within the body region with a first physical spacing from the channel and a second physical spacing from the inner peripheral sidewall of the isolation structure.

13. The design structure of claim 7 wherein the annular conductive interconnect is disposed within the body region with a first physical spacing from the channel and a second physical spacing from the inner peripheral sidewall of the isolation structure.

14. The device structure of claim 11 wherein the annular conductive interconnect is disposed within the body region with a first physical spacing from the channel and a second physical spacing from the inner peripheral sidewall of the isolation structure.

* * * * *